United States Patent
Akizuki et al.

(10) Patent No.: US 7,560,984 B2
(45) Date of Patent: Jul. 14, 2009

(54) TRANSMITTER

(75) Inventors: Taiji Akizuki, Miyagi (JP); Mitsuru Tanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 639 days.

(21) Appl. No.: 11/434,752

(22) Filed: May 17, 2006

(65) Prior Publication Data

US 2006/0264186 A1 Nov. 23, 2006

(30) Foreign Application Priority Data

May 20, 2005 (JP) ............................. 2005-148291

(51) Int. Cl.
*H03G 3/20* (2006.01)
(52) U.S. Cl. ...................... 330/136; 455/108
(58) Field of Classification Search .............. 330/136; 375/295–296; 455/102, 108
See application file for complete search history.

(56) References Cited

U.S. PATENT DOCUMENTS

| | | | |
|---|---|---|---|
| 5,251,330 A | 10/1993 | Chiba et al. | |
| 6,256,482 B1 | 7/2001 | Raab | |
| 7,251,462 B2 * | 7/2007 | Matsuura et al. | 455/108 |
| 7,263,135 B2 * | 8/2007 | Takabayashi et al. | 375/296 |
| 7,359,680 B2 * | 4/2008 | Klemmer | 455/102 |
| 7,378,909 B2 * | 5/2008 | Tomizawa | 330/285 |

* cited by examiner

*Primary Examiner*—Robert Pascal
*Assistant Examiner*—Hieu P Nguyen
(74) *Attorney, Agent, or Firm*—Dickinson Wright, PLLC

(57) ABSTRACT

A transmitter according to the present invention is a transmitter conforming to the EER method, wherein a modulated signal is separated into phase and amplitude components, and the components are input to the high-frequency input terminal and the power supply voltage terminals of a high-frequency power amplifier. This transmitter comprises an amplitude delay corrector and a phase delay corrector capable of correcting delay time so that the phase and amplitude components are optimally synthesized using two or more stages of saturation-type amplifiers constituting the high-frequency power amplifier. With this configuration, a synthesis error can be reduced in each stage of the saturation-type amplifier, and distortion components in the output waveform can be reduced.

9 Claims, 7 Drawing Sheets

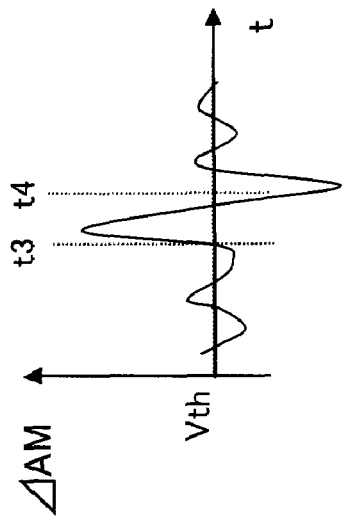
Fig. 6A  Fig. 6B  Fig. 6C
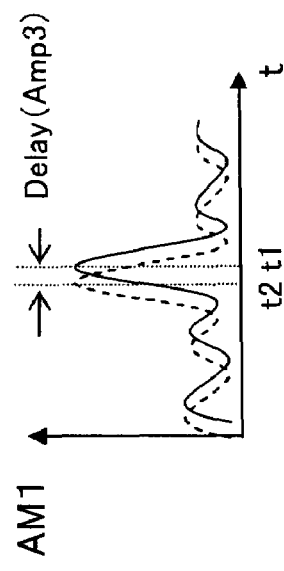
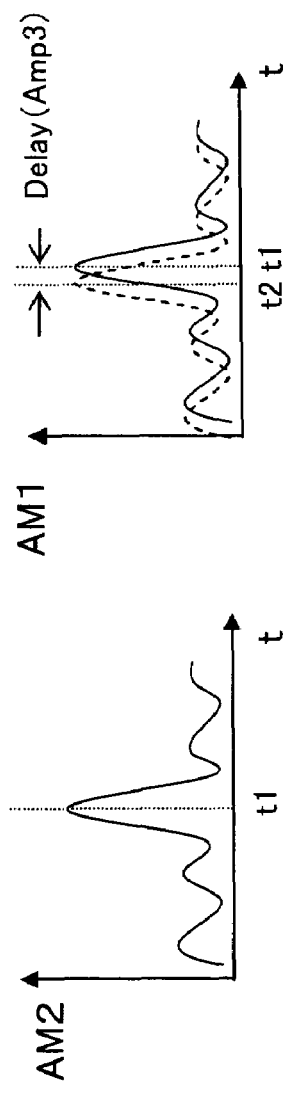
Fig. 6D  Fig. 6E  Fig. 6F
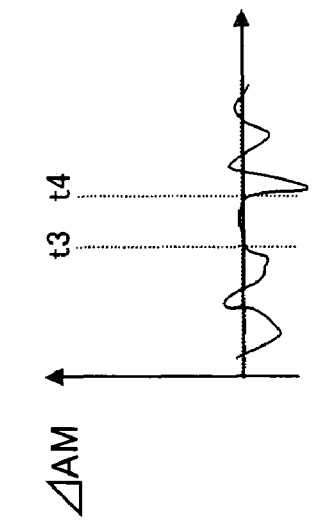
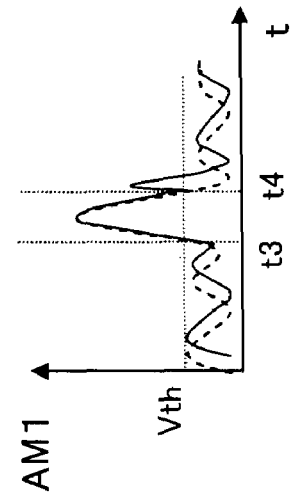
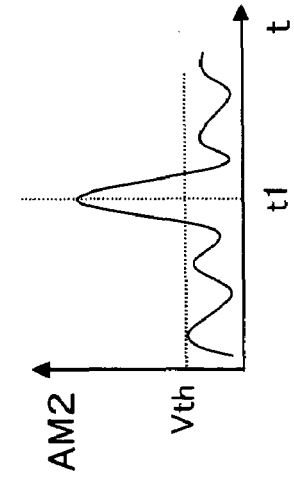

TRANSMITTER

BACKGROUND OF THE INVENTION

1. Field of the Invention

The present invention relates to a wireless transmitter for use in a communication system that uses subcarriers, such as OFDM (Orthogonal Frequency Division Multiplex).

2. Prior Art

Generally speaking, in a modulated signal subjected to amplitude modulation, in particular, a modulated signal subjected to multi-level modulation, such as QAM (Quadrature Amplitude Modulation), linear operation is required in a high-frequency power amplifier to transmit power to an antenna. Hence, class A or class AB has been used as the operation class of the high-frequency power amplifier.

However, as broadband communication is promoted, a communication system that uses subcarriers, such as OFDM (Orthogonal Frequency Division Multiplex), has begun to be used, and the conventional class-A or class-AB high-frequency power amplifier cannot be expected to attain high efficiency. In other words, in OFDM, subcarriers are overlapping, whereby high power is generated instantaneously at random. That is to say, the ratio PAPR (Peak to Average Power Ratio) of the instantaneous maximum power to average power is high. Hence, in order that the instantaneous maximum power can also be amplified linearly, it is necessary to hold high DC power at all times. The power efficiency of the class-A operation is only 50% at the maximum; in particular, in the case of OFDM, since PAPR is high, the power efficiency is only about 10%.

For this reason, in the case of a portable wireless transmitter wherein batteries are used as a power supply, its operable time is short, thereby causing a problem in practical use.

In order to solve this kind of problem, the conventional EER (Envelope Elimination and Restoration) method has been proposed, which is known as Kahn's method (for example, see Patent document 1).

FIG. 7 is a block diagram showing the schematic configuration of the EER method. In FIG. 7, a modulated signal, such as a QAM signal, output from an OFDM signal generating means 100 serving as a modulated signal generating means, is divided into two branches. In one of the branches, the QAM signal is up-converted using an orthogonal modulation circuit 106 and input as a high-frequency modulated wave to the high-frequency input terminal of a high-frequency power amplifier 110 formed of a saturation-type amplifier. In addition, in the other branch, the QAM signal is converted into an amplitude component using an amplitude extracting means 101.

A DC current required to drive the high-frequency power amplifier 110 is supplied to an amplitude amplifying means 102 from a DC power supply having a power voltage Vdd1. Hence, the amplitude amplifying means 102 amplifies the amplitude component by a preset gain and supplies the component to the power voltage terminal of the high-frequency power amplifier 110.

When the power supply voltage of the saturation-type amplifier serving as the high-frequency power amplifier 110 is controlled in proportion to the amplitude component of the high-frequency modulated wave serving as an input signal as described above, the high-frequency modulated wave including the original amplitude component is restored and output from the saturation-type amplifier.

With this configuration, even if the amplitude component of the modulated signal changes, the high-frequency power amplifier formed of the saturation-type amplifiers can be operated in a highly efficient saturated state, and high efficiency can be attained.

In the case that the high-frequency power amplifier is formed of a field effect transistor, for example, the saturation-type amplifier is a class-F amplifier wherein harmonics are controlled so that the waveform of the drain voltage becomes rectangular, or a class-E or class-D amplifier wherein load conditions are optimized so that the waveform of the drain voltage and the waveform of the drain current do not overlap each other. The saturation-type amplifier is characterized in that its power consumption can be suppressed since the period in which the drain voltage and the drain current are generated simultaneously is made as short as possible.

When a power current of 200 mA and a power voltage of 3 V, for example, are supplied to an amplifier, a DC power of 600 mW is obtained. However, in the case of the saturation-type amplifier serving as the high-frequency power amplifier 110, when the field effect transistor is OFF, no current flows but only the power supply voltage is applied. Hence, the DC power consumption is zero. On the other hand, when the field effect transistor is ON, a current of 200 mA flows. However, since the field effect transistor conducts completely, the voltage $V_{DS}$ between the drain and the source can be assumed to be about 0.3 V at most. In this case, a DC power of 0.3 V×0.2 A=0.06 W, that is, 60 mW, is consumed inside the field effect transistor. Hence, the power efficiency reaches a very high value of (600−60)/600=90%. This effect is significant in comparison with the fact that the power efficiency of the class-A amplifier is only 50% at the maximum.

Furthermore, generally speaking, in a transmitter employing the EER method, unless the amplitude component and the phase component at the output terminal of the high-frequency power amplifier are not the accurate reproduction of the amplitude component and the phase component of the original modulated signal, the original modulated signal cannot be reproduced. Since the original modulated signal has been frequency-modulated, the high-frequency modulated wave cannot be reproduced accurately.

Eventually, the errors of the amplitude component and the phase component are revealed by the spectrum distortion or deterioration in the accuracy of modulation in the high-frequency modulated wave to be output.

Hence, in the EER method, a modulated signal, subjected to inverse correction wherein the error functions of the amplitude component and the phase component are obtained beforehand and the inverse functions of the error functions are multiplied, is required to be output from the OFDM signal generating means 100.

In addition, as the modulated signal for obtaining the error functions, a modulated signal, the data rate of which is lower than that of the OFDM modulated signal, is used to reduce the arithmetic processing load at the time when the inverse functions are obtained from the error functions.

Hence, a delay time occurs between the amplitude component and the phase component of the OFDM modulated signal that uses a high-speed data rate, thereby causing spectrum distortion or deterioration in the accuracy of modulation in the high-frequency modulated wave.

Therefore, generally speaking, in a transmitter employing the EER method, the original modulated signal is reproduced by providing a means for correcting the phase delay time of the phase component of the modulated signal and by optimizing the delay time.

Patent document 1: U.S. Pat. No. 6,256,482B1
Patent document 2: U.S. Pat. No. 5,251,330A1

However, in the conventional transmitters, the high-frequency power amplifier comprises multiple stages of amplifiers being connected in series, and the amplitude component being output from an amplitude amplifying means is branched and supplied as the power voltages of two or more amplifiers.

In this configuration, when such a high-speed data rate of 54 Mbps at the maximum as in the wireless LAN IEEE802.11a/g Standard is used as the data rate of the modulated signal, the amount of the delay time between the input and output of the final-stage amplifier at the time when the phase component passes through the final-stage amplifier cannot be ignored in comparison with the data rate.

In other words, in the case that an amplitude component is divided into two branches, for example, and supplied to the power supply terminals of the final-stage amplifier and the other amplifier, the delay time between the phase component and the amplitude component of the final-stage amplifier can be corrected using a means for correcting the phase delay time of the phase component of the modulated signal, and the phase component and the amplitude component can be synthesized. However, in the other amplifier, errors occur in the phase component and the amplitude component by the amount of the delay time between the input and output of the final-stage amplifier at the time when the phase component passes through the final-stage amplifier, and optimal synthesis cannot be attained. In other words, the modulated wave cannot be reproduced accurately at the output terminal of the saturation-type amplifier but is distorted. As a result, there is a problem of causing spectrum distortion or deterioration in the accuracy of modulation in the high-frequency modulated wave.

SUMMARY OF THE INVENTION

Accordingly, an object of the present invention is to provide a transmitter capable of attaining the EER method that does not cause distortion in the modulated wave to be output in the case that a high-speed data rate is used, by optimally controlling the power voltages of the respective stages of the amplifiers of a high-frequency power amplifier comprising multiple stages of amplifiers being connected in series.

For the purpose of solving the above-mentioned problem, the transmitter according to the present invention comprises modulated signal generating means for generating a modulated signal; at least two amplitude amplifying means for amplifying the amplitude component of the modulated signal; first delay time correcting means for adjusting the amount of delay time of the amplitude component of the modulated signal by adding a predetermined amount of amplitude delay time to the amplitude component of the modulated signal supplied to at least any one amplitude amplifying means of at least the two amplitude amplifying means; control means for outputting a control signal according to a signal relating to the magnitude of the amplitude component of the modulated signal; switching means for selecting the amplitude components having different amounts of delay time and being output from at least the two amplitude amplifying means and for outputting the amplitude components to at least two output terminals according to the control signal; second delay time correcting means for adjusting the amount of delay time of the modulated signal by adding a predetermined amount of phase delay time to the modulated signal and for outputting the modulated signal; and a high-frequency power amplifier comprising at least two stages of amplifiers, in which the modulated signal, the amount of phase delay time of which is adjusted using the second delay time correcting means, is input to the high-frequency input terminal thereof, at least two amplitude components being output from at least two output terminals of the switching means are input to the power supply terminals of at least the two stages of amplifiers, respectively, and a modulated wave is output eventually. Furthermore, according to the control signal, the switching means switches whether the amplitude components being output from at least the two amplitude amplifying means, having different amounts of delay time, are supplied to the power supply terminals of at least the two stages of amplifiers separately, or any one of the amplitude components of at least the two amplitude amplifying means is commonly supplied to the power supply terminals of at least the two stages of amplifiers. With this configuration, the amounts of delay time of the amplitude component and the phase component can be adjusted for each stage of amplifier constituting the high-frequency power amplifier.

In the case of a transmitter provided with a phase/amplitude separating means for separating a modulated signal into an amplitude component and a phase component, it is preferable that the signal relating to the magnitude of the amplitude component of the modulated signal should be the amplitude component separated using the phase/amplitude separating means.

Furthermore, in the case of a transmitter provided with an amplitude extracting means for extracting an amplitude component from a modulated signal, it is preferable that the signal relating to the magnitude of the amplitude component of the modulated signal should be the amplitude component extracted using the amplitude extracting means.

With this configuration, at least one of at least the two amplitude amplifying means is provided with the amplitude delay correcting means, and the switching means for selecting the amplitude components having different amounts of delay time and being output from at least the two amplitude amplifying means and for outputting the amplitude components to at least two output terminals according to the control signal, and at least two amplitude components being output from at least the two output terminals of the switching means are input to the power supply terminals of at least the two stages of amplifiers of the high-frequency power amplifier, respectively. Hence, according to the signal relating to the magnitude of the amplitude component of the modulated signal, such as the control signal being output from the control means depending on the voltage level of the amplitude component, the switching means can switch whether two amplitude components having different amounts of delay time are separately supplied from the switching means to the final-stage amplifier and the other amplifier for example, or the same amplitude component is commonly supplied to the final-stage amplifier and the other amplifier.

Hence, at the high-speed data rate and the voltage level having large instantaneous amplitude component fluctuations, in the synthesis of the phase component and the amplitude component in the final-stage amplifier, the phase component, the phase delay time of which is adjusted beforehand using the second delay time correcting means, can be input to the high-frequency input terminal of the final-stage amplifier so as to accurately reproduce the phase component and the amplitude component of the original modulated signal.

In addition, in the synthesis of the phase component and the amplitude component in the other amplifier, the amplitude component, the amplitude delay time of which is adjusted beforehand using the first delay time correcting means, can be input to the power supply terminal of the other amplifier so as to accurately reproduce the phase component and the amplitude component of the original modulated signal.

Hence, the phase component and the amplitude component can be reproduced accurately in the respective stages of the amplifiers of the high-frequency power amplifier, and the distortion components of the output waveform due to a synthesis error caused by the delay time between the phase component and the amplitude component can be reduced.

Furthermore, at the voltage level of the amplitude component having small instantaneous amplitude component fluctuations and having a small synthesis error from the phase component, the amplitude component is supplied to the final-stage amplifier and the other amplifier from only one amplitude amplifying means using the switching means, and the other amplitude amplifying means is not operated, whereby the power loss being consumed can be reduced.

As a result, in the case that the power supply voltages of multiple-stage amplifiers are controlled and that a high-speed data rate is used, a transmitter that does not cause distortion in the output modulated wave and that uses a highly efficient EER method can be attained.

The amplitude component of the modulated signal is supplied using the phase/amplitude separating means that separates the modulated signal into the amplitude component and the phase component, for example, and the phase component of the modulated signal is supplied to the high-frequency input terminal of the high-frequency power amplifier from the phase/amplitude separating means.

Moreover, it may also be possible that the amplitude component of the modulated signal is supplied from the amplitude extracting means that extracts the amplitude component from the modulated signal, and that the modulated signal being output from the modulated signal generating means is directly supplied to the high-frequency input terminal of the high-frequency power amplifier.

In the case of the configuration in which the phase component separated from the modulated signal is supplied to the high-frequency input terminal as described above, even in the case that the instantaneous peak power of the modulated signal has been input to the high-frequency power amplifier, the phase component of the modulated signal, having a level that can sufficiently saturate the high-frequency power amplifier, is input to the high-frequency input terminal. The level remains unchanged even when the high-frequency power amplifier is OFF (the amplitude component is 0). Hence, in the case that the isolation characteristic (the ratio of leakage from the input power in the output power) is improper when the high-frequency power amplifier is OFF, power having a level higher than that of expected output power is output and multiplied with the amplitude component. As a result, no proper modulated wave can be synthesized at the output of the high-frequency power amplifier.

However, in the configuration in which the modulated signal being output from the modulated signal generating means is directly supplied to the high-frequency power amplifier, the power being input to the high-frequency power amplifier is also 0 when the high-frequency power amplifier is OFF (the amplitude component is 0). Hence, the high-frequency power amplifier can synthesize a proper modulated wave, regardless of the isolation characteristic.

Besides, in comparison with the phase component being separated from the modulated signal using the phase/amplitude separating means, the modulated signal itself requires a narrow bandwidth, about ⅙. Hence, it is possible to narrow the bandwidth of digital-analog conversion and the bandwidth of an antialiasing filter that is inserted to suppress spurious components caused by digital-analog conversion. Therefore, this configuration is advantageous in reducing the power consumption of the digital-analog converter and in making the inductor being used in the filter compact in size and low in cost.

Furthermore, the signal relating to the magnitude of the amplitude component of the modulated signal may be one or more predetermined data rate control signals that are used to set the data rate of the modulated signal generated using the modulated signal generating means.

Still further, the signal relating to the magnitude of the amplitude component of the modulated signal may be one or more predetermined power level control signals that are used to set the power level of the modulated signal generated using the modulated signal generating means.

With this configuration, at least one of at least the two amplitude amplifying means is provided with one amplitude delay correcting means. Hence, according to the control signal being output from the control means depending on the signal relating to the magnitude of the amplitude component of the modulated signal, such as one or more predetermined data rate control signals or one or more predetermined power level control signals, the switching means can switch whether two amplitude components having different amounts of delay time are separately supplied from the switching means to the final-stage amplifier and the other amplifier for example, or the same amplitude component is commonly supplied to the final-stage amplifier and the other amplifier.

Hence, at the high-speed data rate setting and high-output power level setting in which instantaneous amplitude component fluctuations are large and the amount of delay time during which the phase component passes through the final-stage amplifier cannot be ignored, during the synthesis of the phase component and the amplitude component in the final-stage amplifier, the phase component, the phase delay time of which is adjusted beforehand using the second delay time correcting means can be input to the high-frequency input terminal of the final-stage amplifier so as to accurately reproduce the phase component and the amplitude component of the original modulated signal.

Furthermore, in the synthesis of the phase component and the amplitude component in the other amplifier, the amplitude component, the amplitude delay time of which is adjusted beforehand using the first delay time correcting means, can be input to the power supply terminal of the other amplifier so as to accurately reproduce the phase component and the amplitude component of the original modulated signal.

Hence, the phase component and the amplitude component can be reproduced accurately in the respective stages of the amplifiers of the high-frequency power amplifier, and the distortion components of the output waveform due to a synthesis error caused by the delay time between the phase component and the amplitude component can be reduced.

Furthermore, at the low-speed data rate setting and low-output power level setting in which instantaneous amplitude component fluctuations are small, a synthesis error from the phase component is eventually small and the amount of delay time during which the phase component passes through the final-stage amplifier can be ignored, the amplitude component is supplied to the final-stage amplifier and the other amplifier from only one amplitude amplifying means using the switching means, and the other amplitude amplifying means is not operated, whereby the power loss being consumed can be reduced.

As a result, in the case that the power supply voltages of multiple-stage amplifiers are controlled and that a high-speed data rate and a high-output power level are used, a transmitter that does not cause distortion in the output modulated wave and that uses a highly efficient EER method can be attained.

Furthermore, in the case that a low-speed data rate and a low-output power level are used, the second amplitude amplifying means is not operated. Hence, the power loss can be reduced further in comparison with the above-mentioned configuration of the present invention. Moreover, since only the first amplitude amplifying means is used, the influence of the variations in the characteristics of the first and second amplitude amplifying means upon the amplitude component can be suppressed to the minimum.

Still further, since the switching means can be controlled before the amplitude component is output, unnecessary amplitude component fluctuations caused by controlling the switching means are not superimposed on the amplitude component. Hence, the distortion components caused in the output of the saturation-type amplifiers can be reduced.

In the above-mentioned transmitter according to the present invention, for example, at least the high-frequency power amplifier formed of an MMIC (microwave monolithic IC) and the switching means formed of a silicon IC, being used as unpackaged devices, may be integrated as a high-frequency power amplifier module (one function device) on the same substrate, that is, may be integrated as an integrated circuit.

With this configuration, the IC element distance between the switching means and the high-frequency power amplifier can be reduced, in comparison with the case in which the separately packaged devices of the switching means and the high-frequency power amplifier are mounted separately on substrates as the devices constituting the transmitter. Therefore, the group delay of the amplitude component, which is caused owing to stray capacitances generated in substrates and device terminals, and also caused owing to capacitances present in packages, can be reduced.

As described above, the present invention can attain a transmitter that uses a highly efficient EER method in which no distortion is caused in the output waveform of a modulated wave in the case that the power supply voltages of multiple stages of amplifiers are controlled and that a high-speed data rate is used.

BRIEF DESCRIPTION OF THE DRAWINGS

FIG. 6A is a graph showing the time characteristic of the amplitude component AM2 of a final-stage amplifier according to Embodiment 1 of the present invention (switching means being fixed);

FIG. 6B is a graph showing the time characteristic of the amplitude component AM1 of a preceding-stage amplifier according to Embodiment 1 of the present invention (switching means being fixed);

FIG. 6C is a graph showing the time characteristic of the amplitude component error between the amplitude component AM1 of the preceding-stage amplifier and the optimal amplitude component required for the preceding-stage amplifier according to Embodiment 1 of the present invention (switching means being fixed);

FIG. 6D is a graph showing the time characteristic of the amplitude component AM2 of the final-stage amplifier according to Embodiment 1 of the present invention (switching means being controlled);

FIG. 6E is a graph showing the time characteristic of the amplitude component AM1 of the preceding-stage amplifier according to Embodiment 1 of the present invention (switching means being controlled);

FIG. 6F is a graph showing the time characteristic of the amplitude component error between the amplitude component AM1 of the preceding-stage amplifier and the optimal amplitude component required for the preceding-stage amplifier according to Embodiment 1 of the present invention (switching means being controlled)

PREFERRED EMBODIMENTS

Embodiment 1

Figure 1:
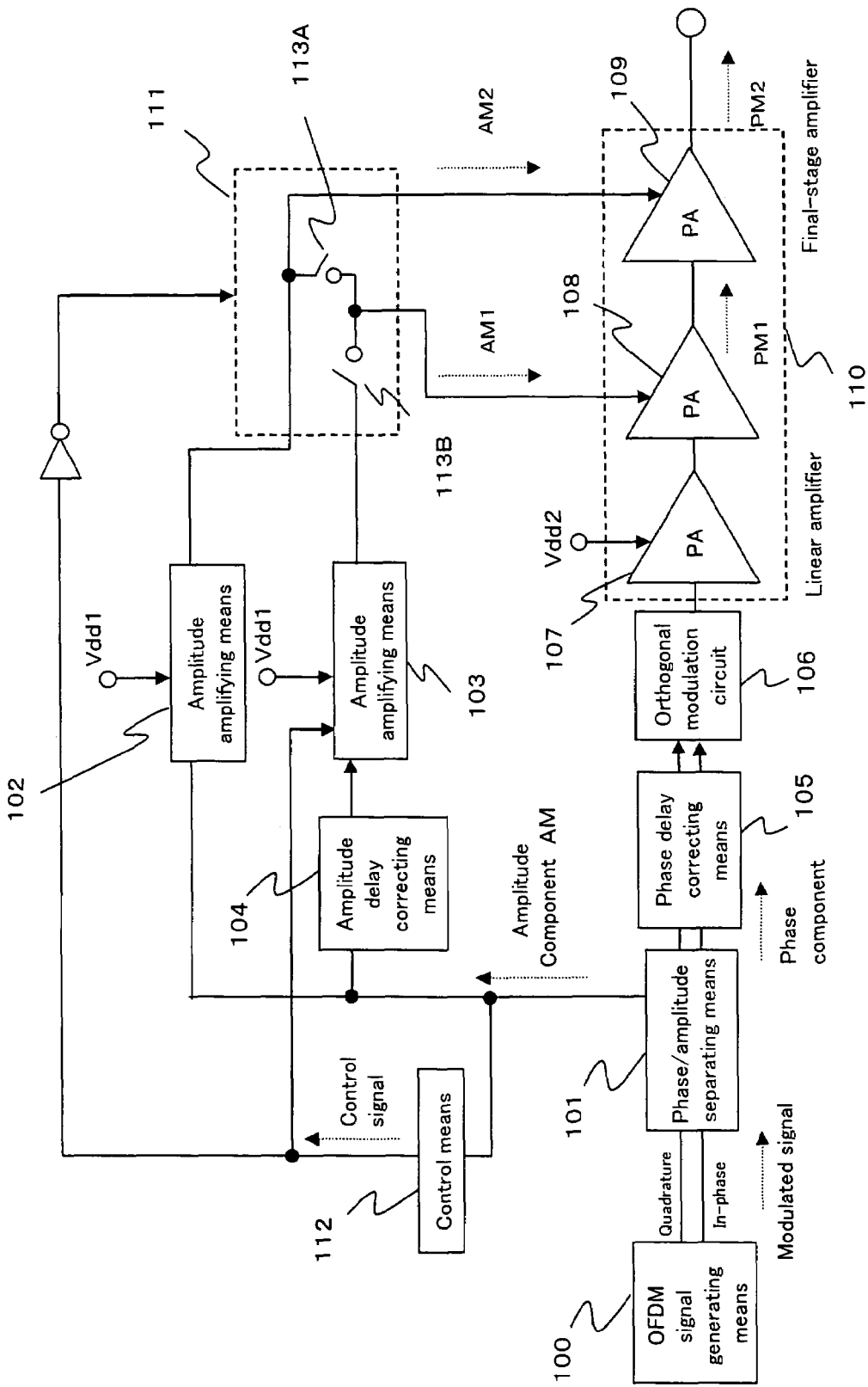
FIG. 1 is a block diagram showing the configuration of a transmitter according to Embodiment 1 of the present invention.

Embodiment 1 according to the present invention will be described below referring to the drawings. In this embodiment of the present invention, a wireless LAN system according to the IEEE802.11a Standard is taken as an example and explained.

FIG. 1 is a block diagram showing a transmitter according to Embodiment 1 of the present invention for attaining a transmitter using the EER method.

As shown in FIG. 1, this transmitter comprises an OFDM signal generating means 100, a phase/amplitude separating means 101, amplitude amplifying means 102 and 103, an amplitude delay correcting means 104, a phase delay correcting means 105, an orthogonal modulation circuit 106, a high-frequency power amplifier 110, a switching means 111, and a control means 112.

The high-frequency power amplifier 110 comprises multiple stages of amplifiers including a linear amplifier 107 and saturation-type amplifiers 108 and 109, for example.

The OFDM signal generating means 100 generates an OFDM-modulated signal and corresponds to a modulated signal generating means.

Next, the operation of the transmitter according to Embodiment 1 described above will be described.

In FIG. 1, an OFDM signal is generated using the OFDM signal generating means 100 serving as a means for generating the signal, and is output as an I (in-phase) signal and a Q (quadrature) signal. The I and Q signals are separated into a phase component and an amplitude component using the phase/amplitude separating means 101. The delay time of the phase component is adjusted by the amount of the delay correction time being preset using the phase delay correcting means 105, and the phase component is output to the orthogonal modulation circuit 106. In the orthogonal modulation circuit 106, the phase component being input thereto is multiplied with a carrier wave and up-converted into a desired high-frequency modulated signal, and the obtained signal is input to the high-frequency modulated signal input terminal of the high-frequency power amplifier 110.

On the other hand, the amplitude component being output from the phase/amplitude separating means 101 is divided into two branches. One of the two branches of the amplitude component is directly input to the amplitude amplifying means 102. The delay time of the other branch is adjusted by the amount of the delay correction time being preset using the amplitude delay correcting means 104, and the other branch is input to the amplitude amplifying means 103.

To the amplitude amplifying means 102 and 103, the DC currents required to drive the high-frequency power amplifier 110 are supplied from a DC power supply having a power voltage of Vdd1. Furthermore, each of the amplitude amplifying means 102 and 103 amplifies the amplitude component by only a preset gain, and outputs the amplitude component to the switching means 111.

As shown in FIG. 1, the switching means 111 comprises two switching circuits 113A and 113B, for example. In addition, the control means 112 compares the level of the amplitude component being output from the phase/amplitude separating means 101 and input to the control means with a preset reference amplitude level, and generates a switching control signal depending on the result of the comparison. The switching means 111 switches the circuit to be operated according to the switching control signal that is output from the control means 112. In other words, according to the switching control signal, the switching means 111 switches whether amplitude components having different delay times are input to the final-stage saturation-type amplifier 109 and the other saturation-type amplifier 108 using both the amplitude amplifying means 102 and 103 or the same amplitude component is input to both the final-stage saturation-type amplifier 109 and the other saturation-type amplifier 108 using only the amplitude amplifying means 102.

Furthermore, in the case of using only the amplitude amplifying means 102, the amplitude amplifying means 103 is controlled so as not to operate according to the switching control signal of the control means 112.

The high-frequency power amplifier 110 operates as a saturation-type amplifier. Hence, the phase component being input to the high-frequency modulated signal input terminal thereof appears as a modulated wave having no amplitude component but having only a phase component at the output terminal. However, the amplitude components being output from the switching means 111 are supplied again from the power supply terminals of the final-stage saturation-type amplifier 109 and the other saturation-type amplifier 108 constituting the high-frequency power amplifier 110, and the amplitude components are multiplied with the phase component. As a result, an OFDM modulated wave having proper phase and amplitude components is obtained.

Furthermore, in this configuration, the correction of the delay time of the amplitude component is carried out using only one of the two amplitude amplifying means. However, it may also possible to have a configuration in which the correction can be carried out using the two amplitude amplifying means, and it may further possible to have a configuration in which the amounts of delay time of the two amplitude amplifying means are adjusted for the amplitude components of the respective stages of amplifiers.

Figure 4:
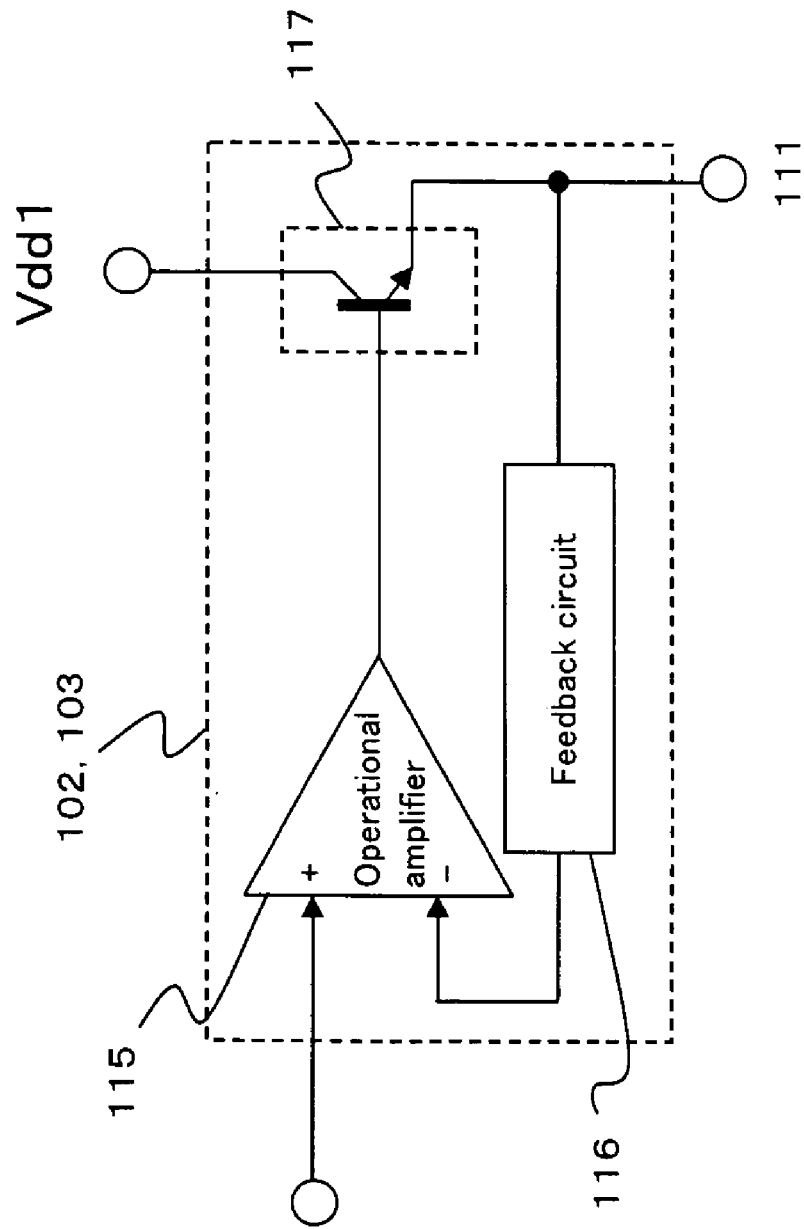
FIG. 4 is an example of a block diagram showing a specific configuration of an amplitude amplifying means.

Moreover, each of the amplitude amplifying means 102 and 103 comprises an operational amplifier 115, a feedback circuit 116, and an emitter follower 117 as shown in FIG. 4, for example, and has a closed loop configuration in which the amplitude component of the output of the emitter follower 117 is fed back negatively.

With this closed loop configuration, the change in the voltage level of the output amplitude component due to the variation in the device characteristics of the operational amplifier 115 and the emitter follower 117 can be reduced.

Still further, it is preferable that the delay time correction in the amplitude delay correcting means 104 is processed using digital signals instead of analog signals.

Figure 5:
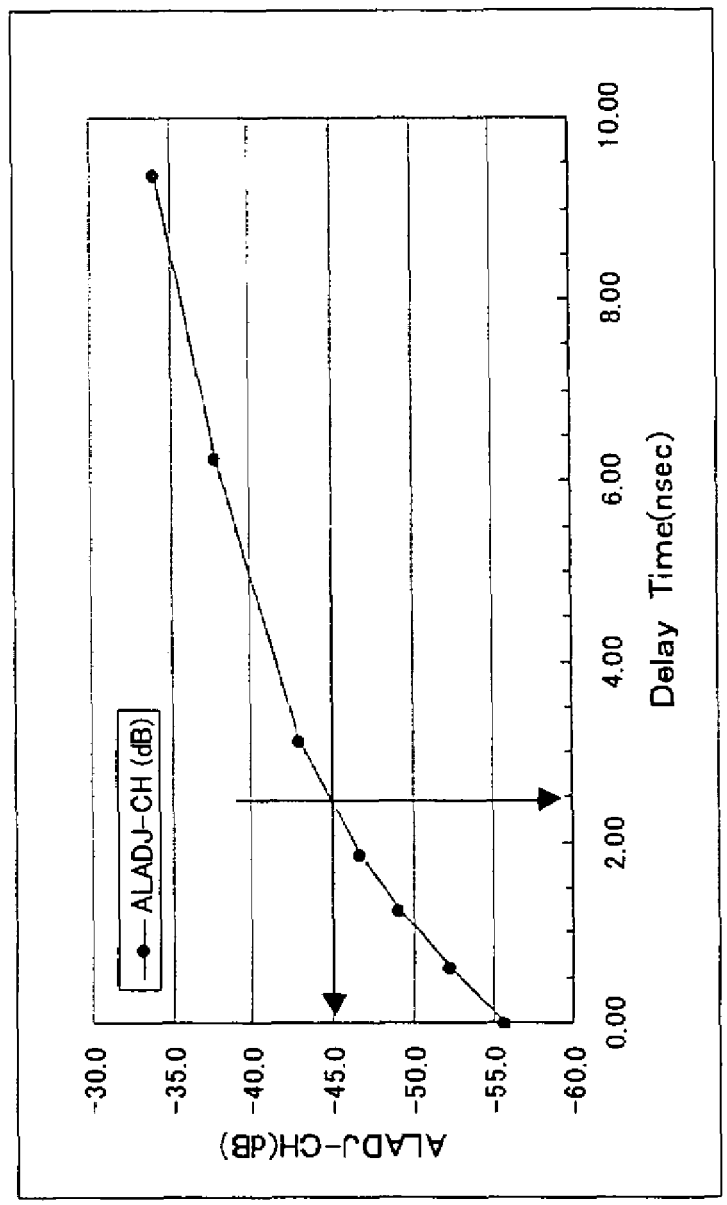
FIG. 5 is a graph showing an alternative adjacent channel leakage power ratio with respect to the error amount of delay time at the time when an amplitude component and a phase component are synthesized.
Figure 7:
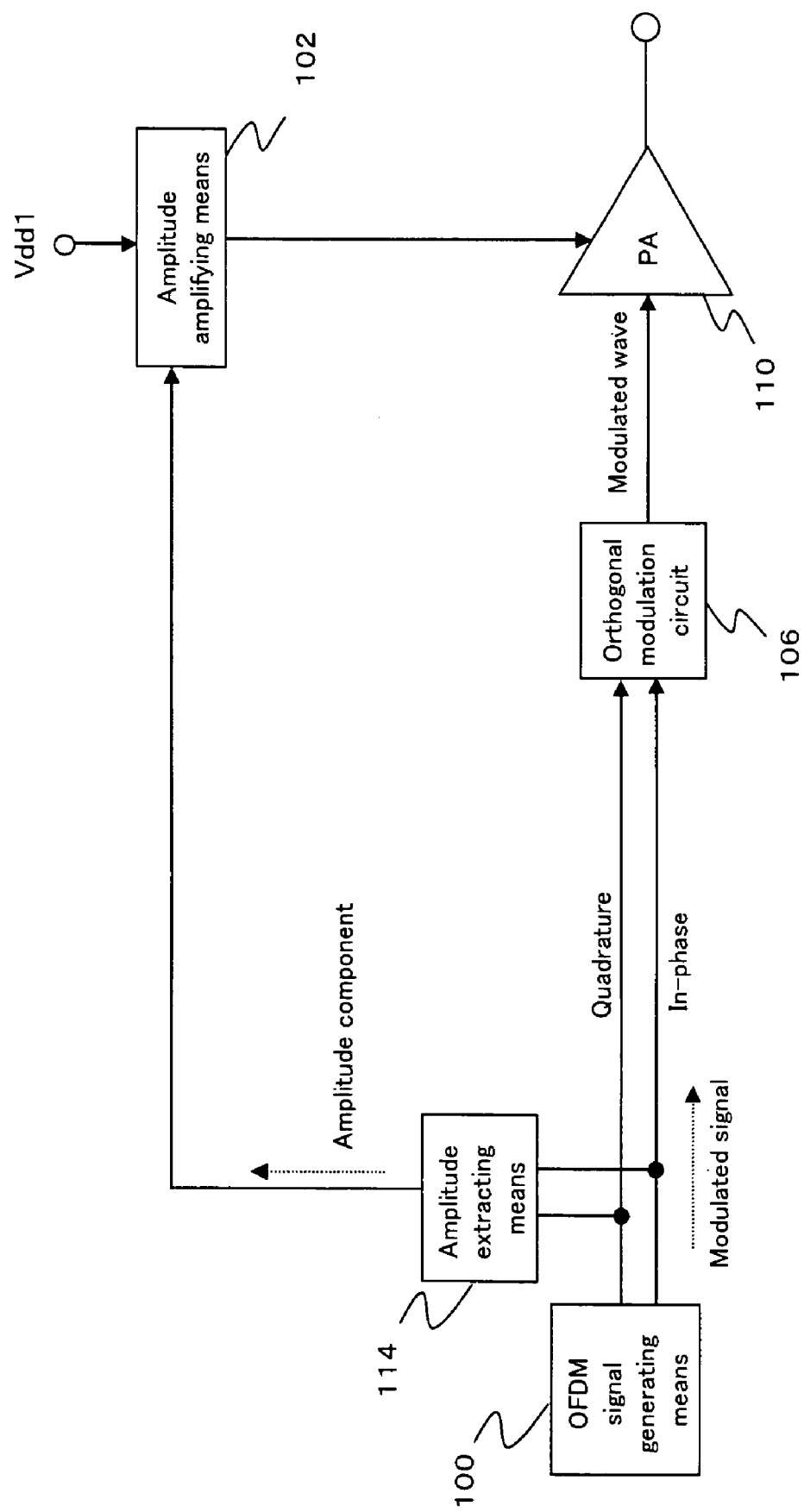
FIG. 7 is a block diagram showing the configuration of the conventional transmitter.

FIG. 5 shows an alternative adjacent channel leakage power ratio (AL-ADJCH characteristic) serving as an indicator of the spectrum waveform characteristic being output with respect to the amount of delay time at the time when the amplitude component and the phase component are synthesized in the high-frequency power amplifier 110. In this characteristic, for the purpose of generating an OFDM modulated signal having a data rate of 54 Mbps, it is assumed that the reference clock for digital processing is 160 MHz. In this case, according to the result shown in FIG. 5, for the purpose of limiting the deterioration of the alternative adjacent channel leakage power ratio within 10 dB from the optimum synthesis, the error of the delay time in the case that the amplitude component and the phase component are synthesized is required to be adjusted within 2.5 nsec (=0.4 clock).

In other words, for the purpose of carrying out the adjustment of such a very small delay time without deforming the waveforms of the amplitude component and the phase component, the adjustment using analog devices is difficult, and linear interpolation processing using digital signals is very advantageous.

A specific example in which the switching means 111 is switched according to the control signal of the control means 112 in the above-mentioned embodiment will be described below.

In FIG. 1, it is assumed that the amplitude component and the phase component being synthesized in the final-stage saturation-type amplifier 109 are AM2 and PM2, respectively, and that the amplitude component and the phase component being synthesized in the preceding-stage saturation-type amplifier 108 are AM1 and PM1, respectively. In addition, it is assumed that time delay Delay (Amp 3) is generated until the phase component PM1 passes through the final-stage saturation-type amplifier 109 and until the phase component PM2 is output.

Furthermore, FIGS. 6A to 6F are views showing the amplitude components of the respective stages of the saturation-type amplifiers 108 and 109 in the case that an OFDM signal having a high-speed data rate and being large in instantaneous amplitude component fluctuations is used. First, a case in which the amplitude component switching means is fixed so that the same amplitude component is supplied to the power supply terminals of the respective stages of the saturation-type amplifiers 108 and 109 will be described using FIGS. 6A, 6B and 6C.

FIG. 6A is a graph showing the time characteristic of the amplitude component AM2 that is used for optimizing delay time correction and for synthesis. FIG. 6B is a graph showing the time characteristic of the amplitude component AM1 in the case that the same amplitude component as that supplied to the final-stage saturation-type amplifier 109 is supplied to the preceding-stage saturation-type amplifier 108. FIG. 6B shows that the amplitude component (written in a solid line) is delayed from the amplitude component (written in a broken line) that is used for optimal synthesis with the phase component PM1 in the preceding-stage saturation-type amplifier 108 by Delay time (Amp 3) during which the phase component PM2 passes through the final-stage saturation-type amplifier 109.

In this case, the amplitude component error (ΔAM) between the amplitude component (written in the broken line) that is used for optimal synthesis in the preceding-stage saturation-type amplifier 108 and the amplitude component AM1 (written in the solid line) supplied to the power supply terminal has a maximum value in the case that the instantaneous amplitude component fluctuations are large as shown in FIG. 6C.

In other words, in the case that the instantaneous amplitude component fluctuations are large, the phase component PM2 and the amplitude component AM2 are synthesized accurately in the final-stage saturation-type amplifier 109. However, in the preceding-stage saturation-type amplifier 108, the synthesis error caused by the amplitude component error ($\Delta$AM) becomes large. As a result, distortion components are generated in the output waveform of the high-frequency power amplifier 110.

Next, a case in which the amplitude component switching means 111 is controlled so that the amplitude components AM1 and AM2 to be supplied to the respective stages of the saturation-type amplifiers 108 and 109 are switched according to the control signal from the control means 112 will be described using FIGS. 6D, 6E and 6F.

In FIG. 6D, in the case that the instantaneous amplitude component fluctuations are large, a preset reference voltage Vth is compared with the amplitude component AM, and the amplitude component AM1 to be supplied to the power supply terminal of the preceding-stage saturation-type amplifier 108 is switched depending on the result of the comparison.

In other words, as the amplitude component AM1 of the preceding-stage saturation-type amplifier 108, if the level of the amplitude component AM is the preset reference voltage Vth or less as shown in FIG. 6E, the switching means 111 is controlled according to the control signal from the control means 112, and the same amplitude component as the amplitude component AM2 of the final-stage saturation-type amplifier 109, being output from the amplitude amplifying means 102, is supplied to the power supply terminal of the preceding-stage saturation-type amplifier 108.

On the other hand, if the level of the amplitude component AM is the preset reference voltage Vth or more, the switching means 111 is controlled according to the control signal from the control means 112, and an amplitude component that is adjusted beforehand by the amount of delay time during which the phase component passes through the final-stage saturation-type amplifier 109, different from the amplitude component AM2 that is output from the amplitude amplifying means 102 and supplied to the power supply terminal of the final-stage saturation-type amplifier 109, is supplied from the amplitude amplifying means 103 to the power supply terminal of the preceding-stage saturation-type amplifier 108.

Therefore, as shown in FIG. 6F, in the case that the level of the amplitude component AM is the reference voltage Vth or more, the amplitude component error ($\Delta$AM) for optimally synthesizing the amplitude component AM1 and the phase component PM1 of the preceding-stage saturation-type amplifier 108 is attenuated to a minimum value. As a result, the distortion components generated in the output waveform of the high-frequency power amplifier are improved.

Embodiment 2

Figure 2:
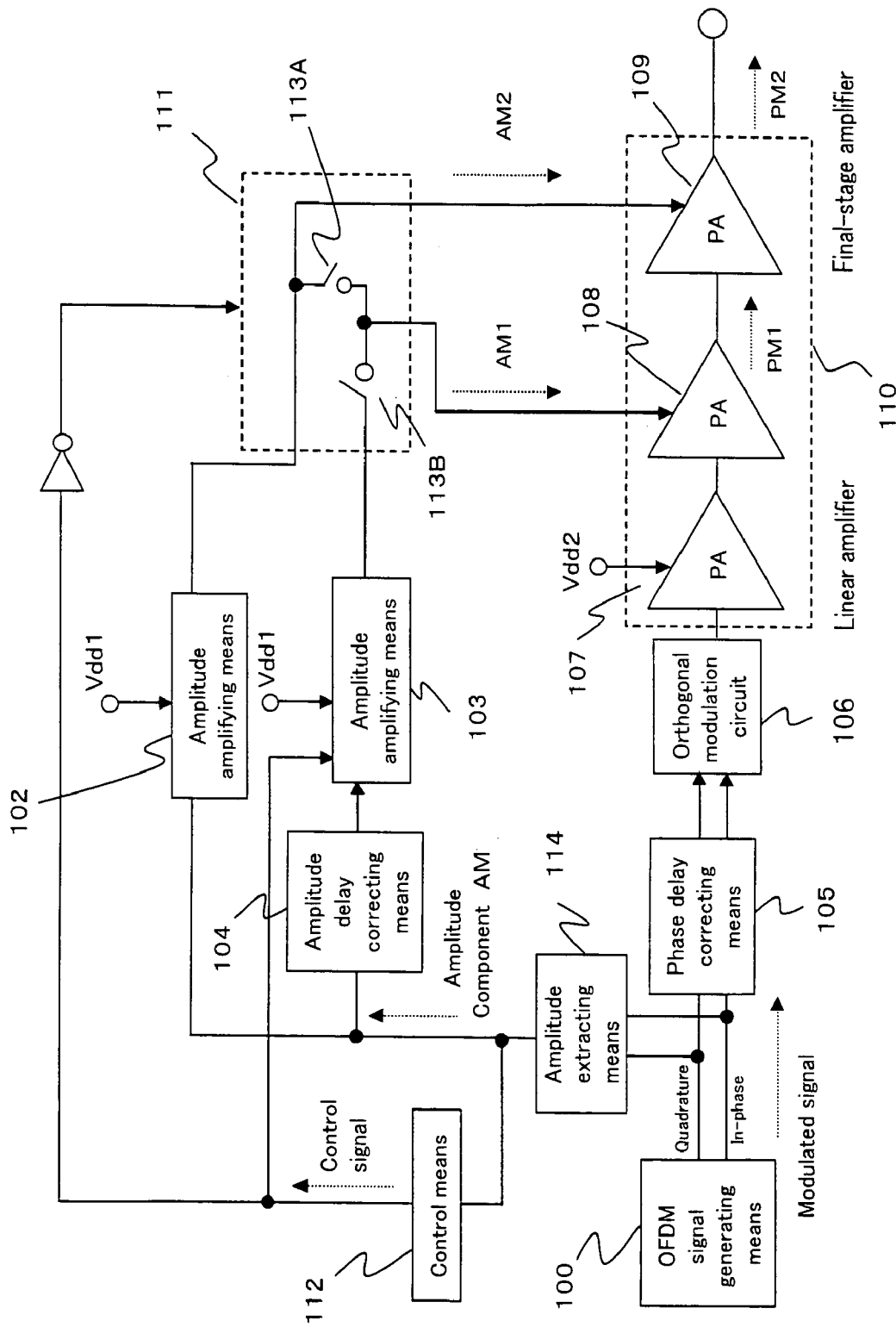
FIG. 2 is a block diagram showing the configuration of a transmitter according to Embodiment 2 of the present invention.

FIG. 2 is a block diagram showing a transmitter according to Embodiment 2 of the present invention. In FIG. 2, the same devices as those shown in FIG. 1 are designated by the same numerals, and their descriptions are omitted.

In this transmitter, as shown in FIG. 2, an OFDM signal generated in the OFDM signal generating means 100 is divided into two branches. One of the two branches of the OFDM signal is input to an amplitude extracting means 114, and an amplitude component is extracted using the amplitude extracting means 114. The amount of delay time of the other of the two branches of the OFDM signal is adjusted by the delay correction time being preset using the phase delay correcting means 105, and the other branch is then output to the orthogonal modulation circuit 106. Embodiment 2 differs from Embodiment 1 in the above-mentioned respect.

With this configuration, the OFDM signal including both the amplitude component and the phase component is input to the high-frequency modulated signal input terminal of the high-frequency power amplifier 110. However, since the high-frequency power amplifier 110 is a saturation-type amplifier, a signal in which the amplitude component is attenuated and only the phase component is included is output as a modulated wave to the output terminal. Hence, the amplitude components being output from the switching means 111 are supplied again to the power supply terminals of the final-stage saturation-type amplifier 109 and the other saturation-type amplifier 108 constituting the high-frequency power amplifier 110, and the phase component is multiplied with the amplitude components. As a result, an OFDM modulated wave having the correct phase and amplitude components is obtained.

In addition, since the OFDM signal is directly input to the high-frequency modulated signal input terminal of the high-frequency power amplifier 110, in the case that the OFDM signal being input is OFF (the amplitude component is 0), the output power is also 0, regardless of the input/output isolation characteristic of the high-frequency power amplifier 110, and a proper modulated wave can be synthesized in the high-frequency power amplifier 110. Therefore, the characteristic of the high-frequency power amplifier 110 can be relieved in comparison with the transmitter configured according to Embodiment 1.

Furthermore, in comparison with a case in which a modulated wave including only a phase component is used, the frequency band required in the OFDM modulated signal is about ⅕. Hence, the frequency characteristic can be relieved further as the frequency band being used is narrower. Therefore, the digital-analog converter of the transmitter according to Embodiment 2 can be made low in power consumption, and the inductor being used for the filter thereof can also be made small in size and low in cost in comparison with the transmitter according to Embodiment 1.

Embodiment 3

Figure 3:
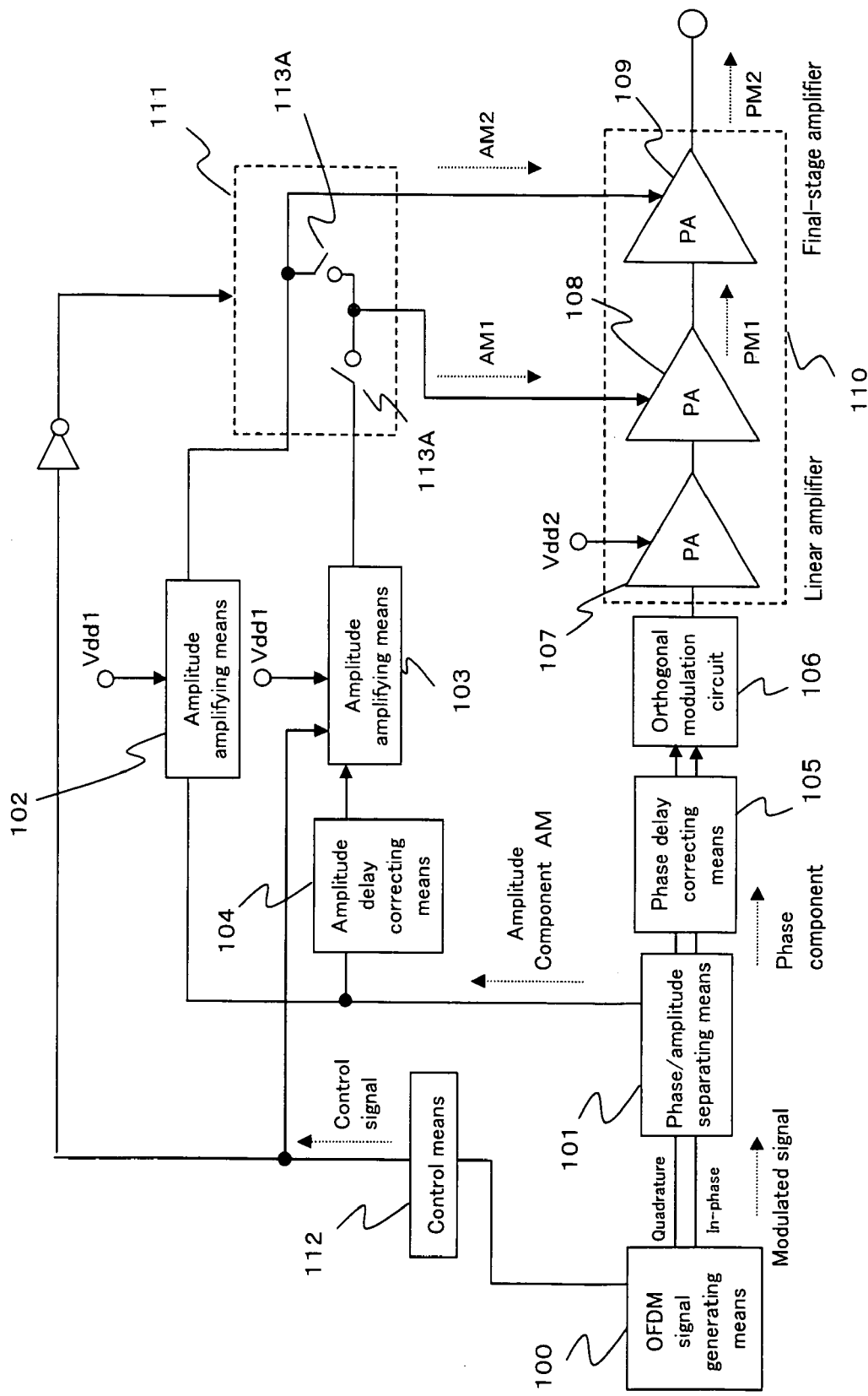
FIG. 3 is a block diagram showing the configuration of a transmitter according to Embodiment 3 of the present invention.

FIG. 3 is a block diagram showing a transmitter according to Embodiment 3 of the present invention. In FIG. 3, the same devices as those shown in FIG. 1 are designated by the same numerals, and their descriptions are omitted.

As shown in FIG. 3, this transmitter is different in that one predetermined control signal of multiple control signals being output from the OFDM signal generating means 100 is used instead of the amplitude component. In other words, in this transmitter, the switching means 111 is controlled according to the predetermined data rate control signal or the power level control signal of the OFDM modulated signal being output from the OFDM signal generating means 100 to switch the amplitude components to be input to the power supply terminals of the respective stages of the saturation-type amplifiers of the high-frequency power amplifier 110. In this respect, Embodiment 3 differs from Embodiment 1 shown in FIG. 1.

The configuration shown in FIG. 2 may also be modified similarly as described above so that the switching means 111 is controlled according to the predetermined data rate control signal or the power level control signal of the OFDM modulated signal being output from the OFDM signal generating means 100, inserted of the amplitude component, to switch the amplitude components to be input to the power supply terminals of the respective stages of the saturation-type amplifiers of the high-frequency power amplifier 110.

With this configuration, in the case that the OFDM modulated signal being output has a low-speed data rate or a low-output power level, the instantaneous amplitude component fluctuations are small to the extent that the error of the synthesis of the amplitude component and the phase component can be ignored, and almost no distortion component is generated in the OFDM modulated wave being output from the high-frequency power amplifier 110. In this case, regardless of the voltage level of the amplitude component, the control means 112 can carry out control so that the switching means 111 supplies the same amplitude component to the final-stage saturation-type amplifier 109 and the other saturation-type amplifier 108 using one amplitude amplifying means 102, and so that the other amplitude amplifying means 103 is not operated.

On the other hand, in the case that the OFDM modulated signal being output has a high-speed data rate or a high-output power level, the instantaneous amplitude component fluctuations are large, and distortion components are generated in the OFDM modulated wave being output from the high-frequency power amplifier 110 owing to the delay time between the amplitude component and the phase component. In this case, regardless of the level of the amplitude component, the amplitude amplifying means 102 and 103 are operated using the control means 112, and the amplitude components, the delay times of which are adjusted beforehand, are supplied to the power supply terminals of the final-stage saturation-type amplifier 109 and the other saturation-type amplifier 108, although the power consumption of this configuration is high. Hence, the control means 112 can carry out control so that the synthesis of the phase and amplitude components can be reproduced accurately in each of the respective stages of the saturation-type amplifiers 108 and 109.

For this reason, in a transmitter that is frequently used mainly in the case that the OFDM modulated signal has a low-speed data rate or a low-output power level, the time during which only one power amplifying means is operated so as to have a low loss is frequent in comparison with the transmitter configured according to Embodiment 1. Hence, the efficiency of the transmitter according to Embodiment 3 can be raised.

In addition, before the OFDM signal is output, the control state setting of the control means 112 is fixed beforehand, whereby the transient response characteristic that occurs when the switching means 111 is controlled are not generated in the amplitude component. Hence, it is possible to output an OFDM modulated signal having low distortion components.

Furthermore, it is not necessary to operate the switching means 111 in response to an amplitude component having a large PAPR and a high instantaneous maximum power. Hence, the circuits being used in the configuration can be simplified.

In each embodiment described above, two stages of saturation-type amplifiers, to the power supply terminals of which the amplitude components are input, are used. However, three or more stages of amplifiers may also be used. In such a case, the amplitude amplifying means, the pair of switches 113A and 113B and the amplitude delay correcting means should only be additionally provided according to the number of stages of the saturation-type amplifiers.

INDUSTRIAL APPLICABILITY

In the high-frequency power amplifier having multiple stages of saturation-type amplifiers in which a modulated signal having a high-speed data rate is used and the delay time during which the phase component passes through each stage amplifier cannot be ignored, the delay time is adjusted for each stage saturation-type amplifier. With this configuration, the transmitter according to the present invention has an effect capable of attaining the EER method that does not cause distortion in the output waveform. The present invention is thus applicable to a transmitter including high-frequency amplifiers in which multiple power supply voltages are controlled.

The invention claimed is:

1. A transmitter comprising:
modulated signal generating means for generating a modulated signal,
at least two amplitude amplifying means for amplifying the amplitude component of said modulated signal,
first delay time correcting means for adjusting the amount of delay time of the amplitude component of said modulated signal by adding a predetermined amount of amplitude delay time to the amplitude component of said modulated signal supplied to at least any one amplitude amplifying means of at least said two amplitude amplifying means,
control means for outputting a control signal according to a signal relating to the magnitude of the amplitude component of said modulated signal,
switching means for selecting the amplitude components having different amounts of delay time and being output from at least said two amplitude amplifying means and for outputting the amplitude components to at least two output terminals according to said control signal,
second delay time correcting means for adjusting the amount of delay time of said modulated signal by adding a predetermined amount of phase delay time to said modulated signal and for outputting said modulated signal, and
a high-frequency power amplifier comprising at least two stages of amplifiers, in which said modulated signal, the amount of phase delay time of which is adjusted using said second delay time correcting means, is input to the high-frequency input terminal thereof, at least two amplitude components being output from at least two output terminals of said switching means are input to the power supply terminals of at least said two stages of amplifiers, respectively, and a modulated wave is output eventually, wherein
according to said control signal, said switching means switches whether the amplitude components being output from at least said two amplitude amplifying means, having different amounts of delay time, are supplied to the power supply terminals of at least said two stages of amplifiers separately, or any one of the amplitude components of at least said two amplitude amplifying means is commonly supplied to the power supply terminals of at least said two stages of amplifiers.

2. The transmitter according to claim 1, further comprising phase/amplitude separating means for separating said modulated signal into an amplitude component and a phase component, wherein the amplitude component of said modulated signal is supplied from said phase/amplitude separating means, and the phase component of said modulated signal is supplied from said phase/amplitude separating means to the high-frequency input terminal of said high-frequency power amplifier.

3. The transmitter according to claim 1, further comprising amplitude extracting means for extracting the amplitude component from said modulated signal, wherein the amplitude component of said modulated signal is supplied from said amplitude extracting means, and said modulated signal being output from said modulated signal generating means is directly supplied to the high-frequency input terminal of said high-frequency power amplifier.

4. The transmitter according to claim 1, further comprising phase/amplitude separating means for separating said modulated signal into an amplitude component and a phase component, wherein the signal relating to the magnitude of the amplitude component of said modulated signal is the amplitude component being separated using said phase/amplitude separating means.

5. The transmitter according to claim 1, further comprising amplitude extracting means for extracting the amplitude component from said modulated signal, wherein the signal relating to the magnitude of the amplitude component of said modulated signal is the amplitude component being extracted using said amplitude extracting means.

6. The transmitter according to claim 1, wherein the signal relating to the magnitude of the amplitude component of said modulated signal is a data rate control signal for setting the data rate of said modulated signal generated using said modulated signal generating means.

7. The transmitter according to claim 1, wherein the signal relating to the magnitude of the amplitude component of said modulated signal is a power level control signal for setting the power level of said modulated signal generated using said modulated signal generating means.

8. The transmitter according to claim 1, wherein an orthogonal modulation circuit is provided in the input section of said high-frequency power amplifier.

9. The transmitter according to claim 1, wherein at least said high-frequency power amplifier and said switching means are integrated as an integrated circuit.

* * * * *